(12) United States Patent
Nozaki et al.

(10) Patent No.: US 6,962,882 B2
(45) Date of Patent: Nov. 8, 2005

(54) METHOD OF FABRICATING A SEMICONDUCTOR DEVICE HAVING A NANOPARTICLE POROUS OXIDE FILM

(75) Inventors: Shinji Nozaki, Kawasaki (JP); Kazuo Uchida, Tokyo (JP); Hiroshi Morisaki, Tsurugashima (JP)

(73) Assignee: Semiconductor Technology Academic Research Center, Yokohama (JP)

( * ) Notice: Subject to any disclaimer, the term of this patent is extended or adjusted under 35 U.S.C. 154(b) by 408 days.

(21) Appl. No.: 10/170,325

(22) Filed: Jun. 12, 2002

(65) Prior Publication Data

US 2002/0197889 A1 Dec. 26, 2002

(30) Foreign Application Priority Data

Jun. 25, 2001 (JP) ........................................ 2001-191783

(51) Int. Cl.[7] .................. H01L 21/31; H01L 21/469
(52) U.S. Cl. ...................................................... 438/787
(58) Field of Search ................................ 438/778, 797, 438/780, 781

(56) References Cited

U.S. PATENT DOCUMENTS

| | | | | |
|---|---|---|---|---|
| 5,902,124 A | * | 5/1999 | Hong | .......................... 438/255 |
| 6,342,454 B1 | * | 1/2002 | Hawker et al. | ............. 438/780 |
| 6,440,560 B1 | * | 8/2002 | Gates et al. | ................. 428/403 |

FOREIGN PATENT DOCUMENTS

| | | |
|---|---|---|
| JP | 55-27953 A | 2/1980 |
| JP | 6-232117 A | 8/1994 |
| JP | 9-275075 | 10/1997 |
| JP | 11-260721 | 9/1999 |
| JP | 11-289013 A | 10/1999 |

OTHER PUBLICATIONS

Nozaki. S., et al., "Ultralow K Nanoporous Silica by Oxidation of Silicon Nanoparticles." The University of Electro–Communications, Department of Electronic Engineering, Tokyo, Japan, presented Jun. 3, 2002, at the 2002 IEEE International Interconnect Technology Conference in Burlingame, CA.

* cited by examiner

Primary Examiner—David A. Zarneke
Assistant Examiner—Lisa Kilday
(74) Attorney, Agent, or Firm—Christensen O'Connor Johnson Kindness PLLC

(57) ABSTRACT

While a crucible containing an Si material and a substrate to be processed are set in a chamber, Ar gas is supplied into the chamber and the Si material is evaporated by heating, thereby forming a nanoparticle thin film of Si on the substrate. This substrate is then annealed in an oxygen atmosphere to oxidize Si, forming a nanoparticle oxide thin film consisting of $SiO_2$.

19 Claims, 4 Drawing Sheets

METHOD OF FABRICATING A SEMICONDUCTOR DEVICE HAVING A NANOPARTICLE POROUS OXIDE FILM

CROSS-REFERENCE TO RELATED APPLICATIONS

This application is based upon and claims the benefit of priority from the prior Japanese Patent Application No. 2001-191783, filed Jun. 25, 2001, the entire contents of which are incorporated herein by reference.

BACKGROUND OF THE INVENTION

1. Field of the Invention

The present invention relates to a semiconductor device fabrication method and, more particularly, to a semiconductor device fabrication method which improves a method of forming a nanoparticle oxide thin film to be used as an interlayer insulator with a low dielectric constant.

2. Description of the Related Art

In the field of semiconductor fabrication, to form an interlayer insulator with a low dielectric constant, a method of fabricating a nanoparticle oxide thin film consisting of Silicon oxide ($SiO_x$) by using evaporation of Si in an Oxygen-containing inert gas has already been proposed (Jpn. Pat. Appln. KOKAI Publication No. 11-289013). Compared to a nanoporous oxide thin film fabricated by the conventional method, a nanoparticle oxide thin film fabricated by this method can relize a low dielectric constant even with a low porosity.

More specifically, an $SiO_x$ nanoparticle thin film fabricated by the gas evaporation method as described above has the following structure and properties.

This $SiO_x$ nanoparticle thin film is expected to have a low dielectric constant because it is made of nanoparticles and the air around them. Since the film is a Silicon oxide film, it does not easily allow any ionized metals to pass through, so the insulation properties are less likely to deteriorate. As the film is a Silicon oxide film, its high-temperature stability is high. Since the film is fabricated by the gas evaportation method, the number of fabrication steps remains the same as that of the present method, so the cost preformance is high. Compared to a porous oxide thin film fabricated by some other method and having an equivalent dielectric constant, the film has a low moisture absorption although it is porous, because its voids are closed.

Unfortunately, the fabrication of this $SiO_x$ nanoparticle thin film by the gas evaporation method has the following problems. The condition of the gas evaporation method generally used as a nanoparticle formation method is that nanoparticles formed using an inert gas do not react with the ambient gas. In the fabrication of an $SiO_x$ nanoparticle thin film, however, Oxygen must be mixed in the ambient gas in order to entrap this Oxygen into nanoparticles. Since the ambient gas reacts with the nanoparticles unlike in the original gas evaporation method, the particle size of the nanoparticles is difficult to control, and the reproducibility of the particle size also worsens. The difficulty in control of the particle size of the nanoparticles deegrades the reproducibility of porosity and that of the dielectric constant based on the porosity of the $SiO_x$ nanoparticle thin film fabricated.

As described above, a method of fabricating an Si nanoparticle oxide thin film by the gas evaporation method using an Oxygen-containing inert gas can be used to form a low-dielectric-constant interlayer insulator. However, this method has the problem that the particle size of the nanoparticles is difficult to control, and the reproducibility of the porosity and dielectric constant is low.

BRIEF SUMMARY OF THE INVENTION

It is an object of the present invention to provide a semiconductor device fabrication method capable of forming, with high particle size controllability, a nanoparticle oxide thin film to be used as, e.g., an interlayer insulator having a low dielectric constant, thereby improving the reproducibility of the porosity and dielectric constant of the nanoparticle oxide thin film. According to the present invention, a semiconductor device fabrication method of forming a nanoparticle oxide thin film to be used as an interlayer insulator with a low dielectric constant is characterized by comprising the steps of forming a nanoparticle thin film of a semiconductor on a substrate to be processed, and oxidizing the semiconductor by annealing the substrate in an oxygen atmosphere, thereby forming a nanoparticle oxide thin film consisting of an oxide of the semiconductor. In the step of forming a nanoparticle thin film of a semiconductor, the semiconductor is evaporated in an inert gas atmosphere, or the substrate is directly coated with nanoparticles of the semiconductor.

Also, according to the present invention, a semiconductor device fabrication method of forming a nanoparticle oxide thin film consisting of $SiO_x$ (x=1 or 2) to be used as an interlayer insulator with a low dielectric constant is characterized by comprising the steps of evaporating Si in an inert gas atmosphere to form a nanoparticle thin film of Si on a substrate to be processed and oxidizing the Si by annealing the substrate in an Oxygen atmosphere, thereby forming a nanoparticle oxide thin film consisting of $SiO_x$. As the inert gas. Aron (Ar) is preferably used. In addition, the pressure of this Ar gas is set at preferably 10 Torr or less and more preferably 1 Torr or less.

Furthermore, according to the present invention, a semiconductor device fabrication method of forming a nanoparticle oxide thin film consisting of $SiO_x$ (x=1 or 2) to be used as an interlayer insulator with a low dielectric constant characterized by the steps of coating a substrate to be processed with a solution in which nanoparticles of Silicon are dispersed and evaporating the solution to form a nanoparticle thin film of the Silicon, and oxidizing the Silicon by annealing the substrate in an Oxygen atmosphere, thereby forming a nanoparticle oxide thin film consisting of Silicon oxide. The substrate is desirably rotated when coated with the solution (spin-on method). The solution is preferably one which does not dissolve the Silicon nanoparticles.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
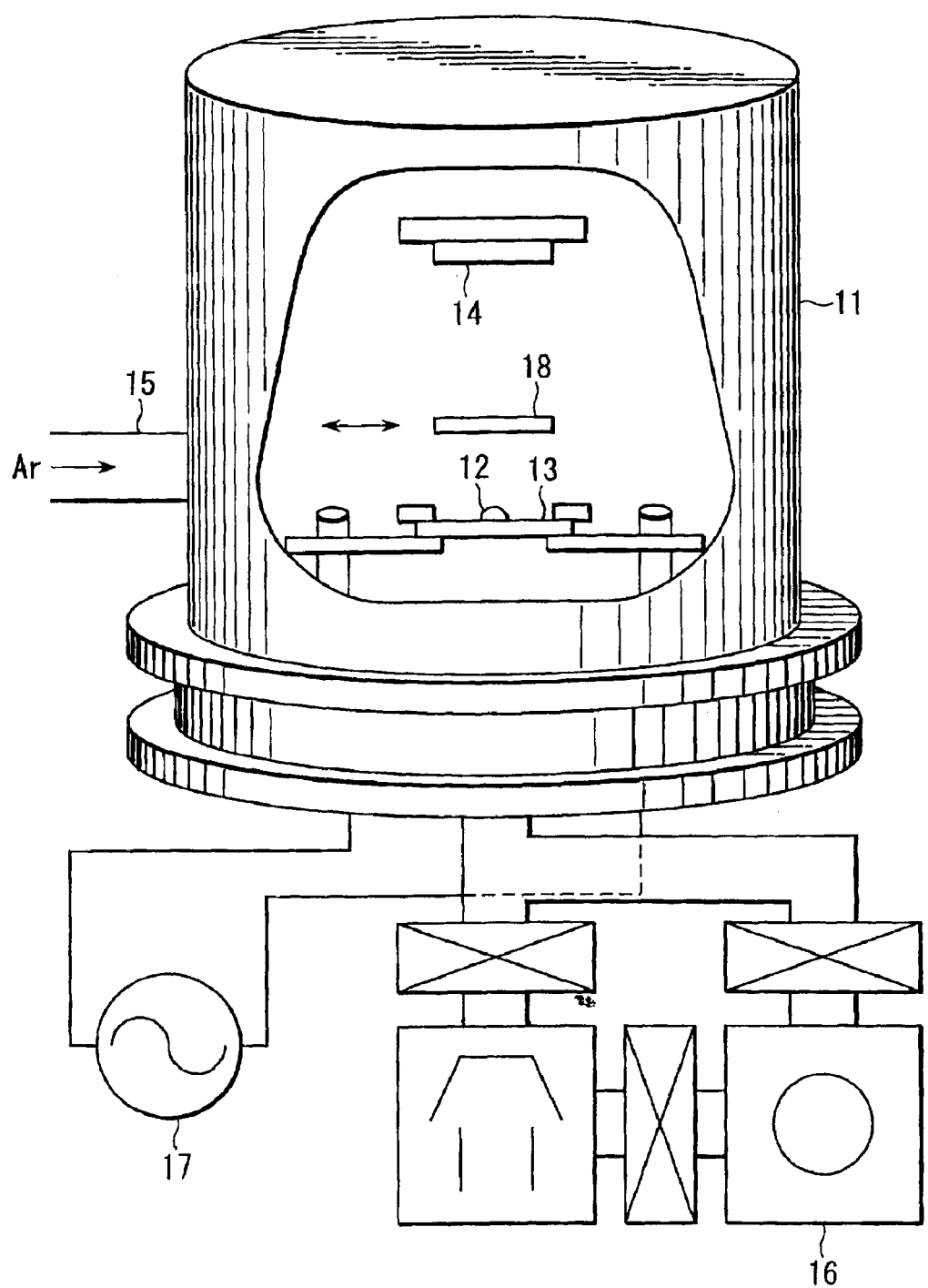
FIG. 1 is a schematic view showing the arrangement of a thin film fabrication apparatus used in the first embodiment of the present invention.

Before the explanation of embodiments of the present invention, the basic principle of the invention will be described.

The present inventors have found that a nanoparticle oxide thin film of $SiO_x$ can be obtained by thermally oxidizing a Silicon nanoparticle thin film, which is fabricated by an original gas evaporation method using an inert gas as an ambient gas, in an oxidizing atmosphere immediately after the fabrication of the film; when an Si nanoparticle thin film is formed into an $SiO_x$ nanoparticle oxide thin film by post-oxidation it is possible to obtain a dielectric constant equivalent to that of an $SiO_x$ nanoparticle oxide thin film fabricated by an Oxygen-containing gas evaporation method: this dielectric constant can be obtained with high reproducibility; and the porosity and dielectric constant of the $SiO_x$ nanoparticle oxide thin film can be controlled by the particle size of Si nanoparticles.

According to the present invention, therefore, a nanoparticle thin film of a semiconductor (Si) is formed on a substrate by evaporating this semiconductor in an inert gas atmosphere such as Ar atmosphere, and a nanoparticle oxide thin film ($SiO_x$) is formed by oxidizing the semiconductor by annealing the substrate in an oxidizing atmosphere. In this manner, it is possible to form a nanoparticle oxide thin film with high particle size controllability, and improve the reproducibility of the porosity and dielectric constant of the nanoparticle oxide thin film. In particular, the porosity and dielectric constant of the nanoparticle oxide thin film can be controlled with high reproducibility by selecting the formation conditions of Si nanoparticles.

A nanoparticle thin film need not be formed by the gas evaporation method; the film can also be formed by coating a substrate directly with nanoparticles. Even when the coating method is thus used instead of the gas evaporation method, a nanoparticle oxide thin film can be formed with high particle size controllability by performing post-oxidation. So, the reproducibility of the porosity and dielectric constant of the nanoparticle oxide thin film can be improved.

In the present invention as described above, after a nanoparticle thin film of a semiconductor is formed on a substrate by the gas evaporation method or the coating method, this semiconductor is oxidized by annealing in an oxygen atmosphere. Consequently, a nanoparticle oxide thin film to be used as an interlayer insulator with a low dielectric constant can be formed with high particle size controllability, so the reproducibility of the porosity and dielectric constant of the nanoparticle oxide thin film can be improved.

Note that patents by which a porous oxide film is applied as an inter-wiring dielectric and interlayer insulator have already been filed. However, to set the relative dielectric constant of the existing porous oxide film to, e.g., 2.5, the porosity of the film must be greatly raised. When this is the case, the mechanical strength of the film may fall; or the electrical characteristics (conductivity and relative dielectric constant) readily change with time owing to absorption of water. Presently, therefore, a porous oxide film is difficult to apply as an interlayer dielectric or inter-wiring dielectric.

By contrast, in a nanoparticle oxide thin film fabricated by the method as in the present invention, pores form closed spaces and do not extend to the surface, although the porosity is high. Accordingly, water absorption is relatively small, so changes with time are also small. Unlike conventional porous oxide films, therefore, a nanoparticle oxide thin film of the present invention functions well as a low-dielectric-constant inter-wiring dielectric and interlayer dielectric. Additionally, low dielectric constants can be realized with porosities lower than films in which pores extend to the surface.

A nanoparticle oxide thin film according to the present invention greatly differs from porous oxide films fabricated by the conventional methods, because nanoparticles are densely packed and connected in the form of a chain by the oxide film. Such films cannot be realized by any conventional films. This is so because no nanoparticles are formed in any conventional films. The characteristic feature of the present invention is this low-dielectric-constant material based on nanoparticles.

The present invention will be described in detail below by way of its embodiments.

(First Embodiment)

FIG. 1 is a schematic view showing the arrangement of a thin film formation apparatus used in a method of fabricating a nanoparticle oxide thin film according to the first embodiment of the present invention.

In FIG. 1, reference numeral 11 denotes a hermetically sealed chamber. On the bottom of this chamber 11, a crucible 13 for evaporating an Si material 12 as an evaporation source is placed. A BN (Boron nitride) boat is used as the crucible 13. By supplying electricity to this BN boat 13, the Si material 12 is heated and evaporated. A substrate 14 to be processed is attached above the crucible 13 in the chamber 11.

A gas supply pipe 15 is connected to the chamber 11. Ar gas as an inert gas is supplied into the chamber 1 through this gas supply pipe 15. Gas in the chamber 11 is exhausted by a vacuum pump 16. Reference numeral 17 in FIG. 1 denotes a power supply for heating the BN boat as the crucible 13 by supplying a direct or alternating current. Reference numeral 18 in FIG. 1 denotes a shutter positioned between the crucible 13 and the substrate 14 to stop the progress of Si vapor from the crucible 13 to the substrate 14.

An example in which the present invention was applied to the fabrication of an interlayer insulator in a semiconductor fabrication process will be explained below.

Figure 2:
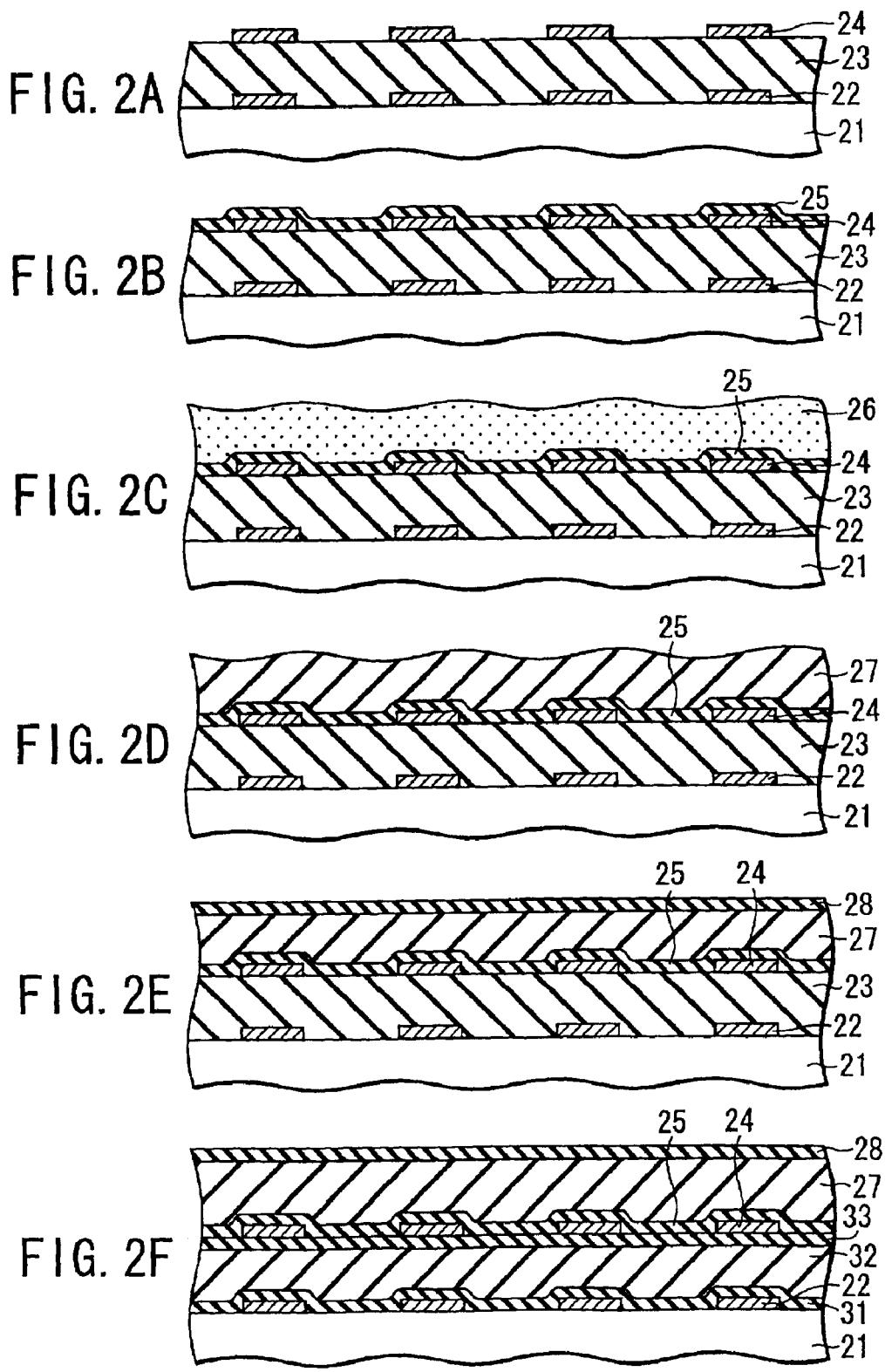
FIGS. 2A to 2F are sectional views showing an example in which the present invention was applied to the formation of an interlayer insulator in a semiconductor fabrication process.

First, as shown in FIG. 2A, a substrate having two wiring layers was prepared. In this substrate, a first wiring layer 22 made of Al was formed on an Si substrate 21, a first inter-wiring insulator 23 made of a CVD-SiO$_2$ film was formed on this first wiring layer 22, and a second wiring layer 24 made of Al was formed on this first inter-wiring insulator 23. As wiring layers 22 and 24, it may use Cu instead of Al.

Referring to FIG. 2A, the two wiring layers 22 and 24 are vertically aligned. However, these two wiring layers need not be aligned and can have various forms in practice. Also, the Si substrate 21 is not a bulk substrate of Si. That is, various devices are formed in this Si substrate 21, and an insulating film is formed on its surface.

As shown in FIG. 2B, an SiO$_2$ oxide film 25 was formed by CVD on the substrate with the structure shown in FIG. 2A.

Subsequently, the substrate was set in the chamber 11 of the apparatus shown in FIG. 1, and the chamber 11 was well evacuated until the internal pressure was $1.0 \times 10^{-2}$ Torr or less. After that, the vacuum valve was closed, and an ambient gas (Ar) was supplied into the chamber 11 until a predetermined pressure (e.g., 0.3 Torr) was obtained. In addition, a voltage was applied to the BN boat 13, and the temperature was measured by a pyrometer. When the temperature stabilized at 1,450° C., the shutter 18 was opened to deposit nanoparticles on the substrate. By performing the processing under the above conditions for 10 min, as shown in FIG. 2C, an Si nanoparticle film (nanoparticle thin film) 26 having a film thickness of, e.g., 0.3 μm was formed. The particle size of the Si nanoparticles was, e.g., about a several nm.

The mechanism of forming this Si nanoparticle thin film is as follows. A gas evaporation method is used to evaporate a substance to be formed into nanoparticles by heating the substance, and coagulate the vapor of the substance into nanoparticles by cooling the vapor. The vapor produced by the evaporation gradually cools while diffusing in the gas, and causes nucleation in a supersaturated state. A region (vapor region) where the vapor spreads is formed on the evaporation surface, nucleation occurs outside this vapor region, and at substantially the same time most of the vapor coagulates (vapor growth). The particles rise as they are carried by convection. Although the vapor growth stops by cooling as the particles rise, the particles collide against each other and fuse with each other (fusion growth). After that, these particles deposit on a substrate.

Next, the substrate having the structure shown in FIG. 2C was annealed in an oxidizing atmosphere at a temperature of 400° C. for about 2 hours. Consequently, as shown in FIG. 2D, a nanoparticle film (nanoparticle oxide thin film) 27 of SiO$_x$ (x=1 or 2) was formed. This dry oxidation can be performed in chamber 11 of the apparatus shown in FIG. 1, or in a seperately prepared chamber dedicated to oxidation. When the apparatus shown in FIG. 1 is used. Oxygen gas is supplied into the chamber 11 after the supply of the Ar gas is stopped, and the substrate 14 is heated to a temperature of 400° C. by a heater (not shown).

The SiO$_x$ nanoparticle oxide thin film 27 thus formed had a relative dielectric constant of about 1.5, which was much lower than that of common SiO$_2$ (relative dielectric constant =4.0), and had porosity lower than that of a nanometer-order oxide thin film fabricated by the conventional method. That is, this SiO$_x$ nanoparticle oxide thin film 27 exhibited characteristics desirable as an interlayer insulator.

Subsequently, as shown in FIG. 2E, the SiO$_x$ nanoparticle oxide thin film 27 was planarized by polishing, and an oxide film 28 made of SiO$_2$ was formed on this SiO$_x$ nanoparticle oxide thin film 27 by CVD. In this structure, the three oxide films 25, 27, and 28 are second interlayer insulator. Also, there is always not need in oxide film 25, 28 and it may omit these oxide film 25, 28. In this case, it composes the second interlayer insulator only by oxide film 27.

To confirm the effects of the present invention, the apparatus shown in FIG. 1 was used to conduct the following experiment. That is, the Ar gas pressure in the chamber 11 was set at 0.1 to 0.5 Torr, and Silicon was evaporated by the gas evaporation method. The evaporated Silicon grew as nanoparticles while colliding against the ambient gas and deposited as a porous Silicon nanoparticle film on a substrate to be processed. The growth time was set to e.g. 10 minutes. The pressure of the Ar gas atmosphere was set at 0.1 0.3 and 0.5 Torr. The nanoparticle thin film was subjected to dry oxidation at 400° C. for 2 hours.

Figure 3:
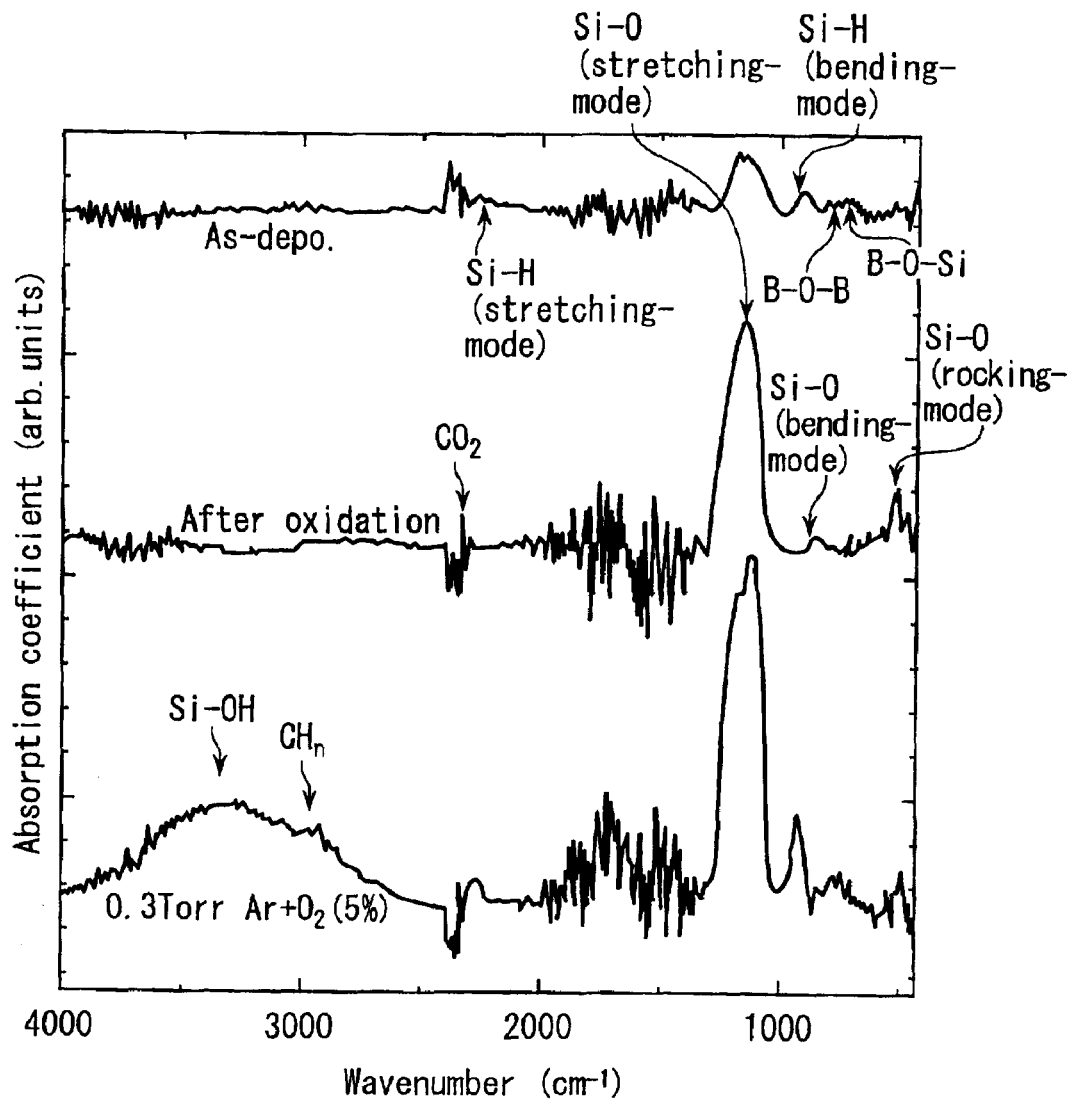
FIG. 3 is a graph showing the FTIR (Fourier Transformation Infrared) characteristics of an $SiO_x$ nanoparticle thin film obtained by thermally oxidizing a nanoparticle thin film fabricated in Ar ambient gas.

FIG. 3 shows FTIR (Fourier Transform Infared), before and after thermal oxidation of an SiO$_x$ nanoparticle thin film obtained by thermally oxidizing nanoparticles formed in Ar ambient gas at 0.3 Torr. For comparison FTIR of an SiO$_x$ nanoparticle thin film fabricated in an Oxygen-containing Ar gas atmosphere is also shown. The film thickness of three samples (samples before and after thermal oxidation and a sample fabricated in the Oxygen-containing gas atmosphere) are substantially the same.

The sample called as-depo obtained before thermal oxidation had a low peak strength related to Si—O near 1,000 cm$_{-1}$, indicating a low oxidation degree. The thermally oxidized sample (after oxidation) had a high peak strength concerning Si—O showing that oxidation had progressed. This means that the oxidation was well performed at such a low temperature as 400° C. The thermally oxidized sample did not have broad peaks that might result from water absorbed or absorbed at 3,000 to 3,800 cm$_{-1}$ as the sample contained no water even before the thermal oxidation. This is probably because the pores of nanoparticles formed in an Ar atmosphere, as in the present invention are closed at surface.

Figure 4:
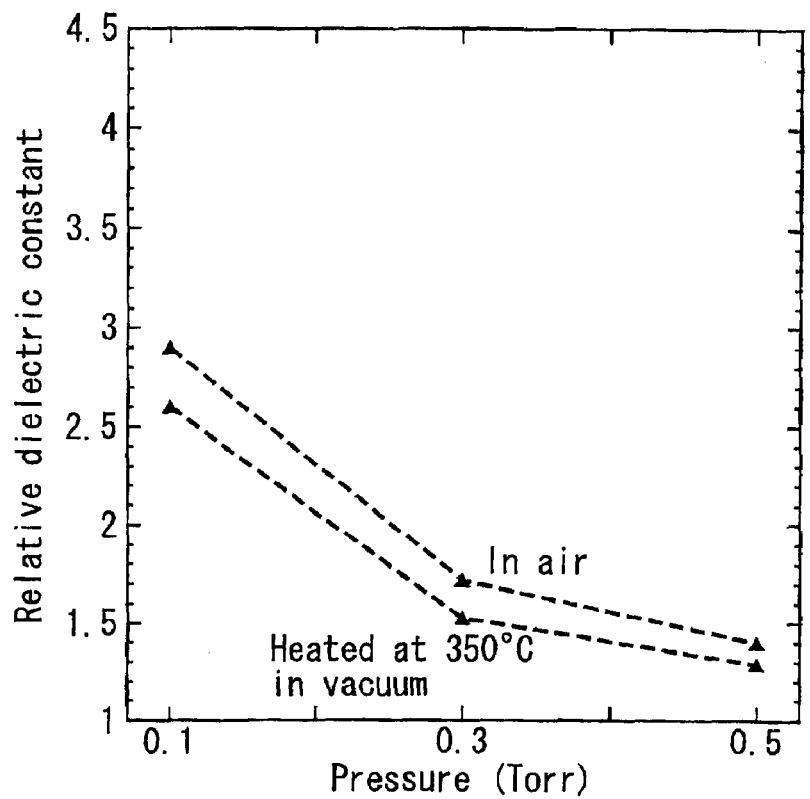
FIG. 4 is a graph showing the relationship between the gas pressure and the relative dielectric constant of an $SiO_x$ nanoparticle thin film obtained by thermally oxidizing a nanoparticle thin film fabricated in Ar ambient gas and, particularly, showing the results measured after the $SiO_x$ nanoparticle thin film was heated in the air and in a vacuum.

FIG. 4 shows the relative dielectric constants of nanoparticle thin film fabricated by changing the Ar gas pressure when each film was left to stand in air after being thermally oxidzed or was heated in a vacuum. For comparison FIG. 5 shows the relative dielectric constants of nanoparticle thin films fabricated in an Oxygen-containing gas atmosphere when each film was left to stand in an air or heated in a vacuum.

Figure 5:
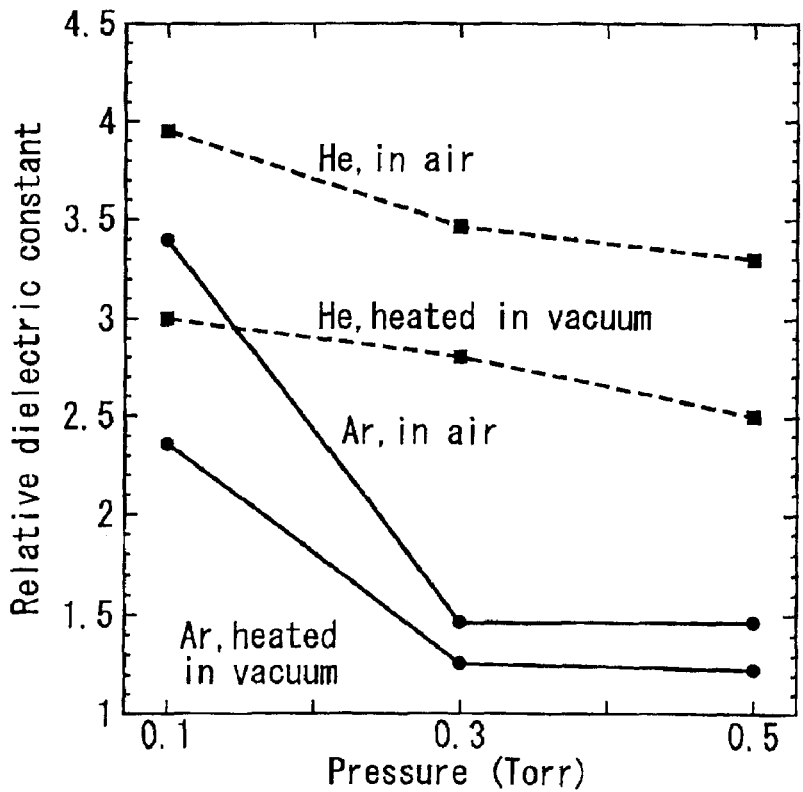
FIG. 5 is a graph showing the relationship between the gas pressure and the relative dielectric constant of an $SiO_x$ nanoparticle thin film fabricated in an Oxygen-containing gas atmosphere and particularly, showing the results measured after the $SiO_x$ nanoparticle thin film was heated in the air and in a vacuum.

When the films fabricated in the atmosphere containing only Ar gas shown in FIG. 4 (present invention) are compared to the films fabricated in the Oxygen-containing gas atmosphere shown in FIG. 5 (prior art) the values of the relative dielectric constants of the former films are very close to those of the latter films, but the difference between the relative dielectric constants measured in the air and after heating in a vacuum of the former films is smaller than that of the latter films. In addition, the difference between the relative dielectric constants with respect to gas pressure change from 0.3 to 0.5 Torr of the former films is clearer than that of the latter films. Accordingly, an SiO$_x$ nanoparticle oxide thin film obtained by thermally oxidizing a film fabricated in an Ar gas atmosphere presumably allows more accurate porosity control and absorbs little water.

The measurement results in FIG. 5 for comparison demonstrate that when Oxygen-containing Ar gas was used, no large change in the relative dielectric constant with respect to a gas pressure change of 0.3 to 0.5 Torr was found in the air and after heating in a vacuum. That is, the relative dielectric constant can be controlled by the Ar gas pressure when a nanoparticle thin film is oxidized after being formed as in the present invention.

Also, in the present invention by which a nanoparticle thin film is oxidized after being formed by the gas evaporation method using Ar gas, the higher the Ar gas pressure the smaller the relative dielectric constant of the finally obtained nanoparticle oxide thin film. However, if the Ar gas pressure exceeded 10 Torr, the susceptibility to moisture of the thin film increased, and this made the film inadequate as an insulating film in respect of a leakage current. Therefore, the Ar gas pressure must be 10 Torr or less and is desirably 1 Torr or less.

The first interlayer insulator 23 is a CVD-$SiO_2$ film in the fabrication steps shown in FIGS. 2A to 2E, and the present invention is also applicable to this insulating film. More specifically, as shown in FIG. 2F, this first interlayer insulator can also be a three-layered oxide film made up of an $SiO_2$ oxide film 31, an $SiO_x$ nanoparticle oxide thin film 32, and an $SiO_2$ oxide film 33. Note also that the interconnects 22 and 24 need not be formed on the surface of the insulating film. That is, a Cu interconnect or the like can also be buried in an interlayer insulator by using the damacine method.

Furthermore, the $SiO_x$ nanoparticle oxide thin film need not be sandwiched between $SiO_2$. In the above embodiment, the dielectric constant is low and the porosity is relatively large. If the porosity is sufficiently small, however, a single $SiO_x$ nanoparticle oxide thin film can be used as an interlayer insulator.

(Second Embodiment)

The second embodiment of the present invention will be described below. This embodiment relates to a method which uses the coating method instead of the gas evaporation method to form a nanoparticle thin film. The rest is the same as the first embodiment.

In this embodiment a substrate to be processed as shown in FIG. 2A is spin-coated by the spin-on method with a material prepared by dispersing Si nanoparticles in alcohol. During the coating, the substrate is rotated at e.g., 2.000 rpm by a spinner. The Si nanoparticles used herein can be commercially available Si nanoparticles formed by the gas evaporation method or can be Si nanoparticles formed by a method other than the gas evaporation method. Although Methyl alcohol is used as a solution any organic material can be used as long as the material does not dissolve the Si nanoparticles. The rotating speed of the spinner is not a strict value because the speed changes in accordance with the thickness of the Si nanoparticle thin film for coating. The coating time is 3 minutes in order to obtain a film thickness of e.g., 0.5 $\mu$m. However, this coating time also changes in accordance with the thickness of the coating film.

After the Si nanoparticles are formed by coating, the coating film is heated in air at 190° C. for 5 minutes to evaporate the solution. Consequently, as shown in FIG. 2B, an Si nanoparticle thin film is formed. After that, oxidation is performed in the same manner as in the first embodiment described above, thereby forming a nanoparticle oxide thin film consisting of $SiO_x$ (x=1 or 2) as shown in FIG. 2C.

In this embodiment as described above, an Si nanoparticle thin film can be formed on a substrate to be processed, even when the coating method is used in place of the gas evaporation method. An $SiO_x$ nanoparticle oxide thin film can be formed by oxidizing the formed Si nanoparticle thin film. As a consequence, effects similar to those of the first embodiment can be obtained.

(Modifications)

The present invention is not limited to the aforementioned embodiments. In the embodiments, the Ar gas pressures in the gas evaporation method were set at 0.1, 0.3, and 0.5 Torr. However, this Ar gas pressure can be 10 Torr or less, desirably, 1 Torr or less, from the viewpoints of the susceptibility to moisture and the dielectric constant. Also, the gas used in the gas evaporation method is not limited to Ar, so it is possible to use another inert gas such as He or Ne. Furthermore, Si was used as a material for forming nanoparticles, but some other semiconductor material can also be used.

In the embodiments, annealing was preformed at 400° C. for 2 hours in the thermal oxidation step. However, the present inventors have found that satisfactory oxidation is possible even by annealing at 350° C. for 1 hour. Since steps performed at too high temperatures are undesirable as post steps of the Silicon process, it is desirable to lower the temperature and shorten the time as much as possible provided that satisfactory oxidation is possible in the thermal oxidation step. The present invention is not limited to the fabrication of an interlayer insulator but applicable to the fabrication of various insulating films requiring low dielectric constants.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of fabricating a semiconductor device having a nanoparticle porous oxide film, comprising:
    forming a nanoparticle porous film of a semiconductor on a substrate to be processed; and
    oxidizing the semiconductor by annealing the substrate in an Oxygen atmosphere, thereby forming a nanoparticle porous oxide film consisting of an oxide of the semiconductor.

2. A method according to claim 1, wherein the step of forming the nanoparticle porous film of the semiconductor on the substrate to be processed comprises using Silicon (Si) as the semiconductor material for forming the nanoparticle porous film.

3. A method according to claim 1, wherein the step of forming the nanoparticle porous film of the semiconductor on the substrate to be processed comprises forming the nanoparticle porous film in which pores do not extend to the surface but are closed.

4. A method according to claim 1, wherein the nanoparticle porous oxide film formed by oxidizing the semiconductor is used as an interlayer insulator requiring a low dielectric constant.

5. A method according to claim 1, wherein the step of forming the nanoparticle porous film of the semiconductor on the substrate to be processed comprises supplying an inert gas into a vessel which contains the substrate and heating the semiconductor, thereby evaporating the semiconductor in an inert gas atmosphere.

6. A method according to claim 5, wherein Argon (Ar) is used as the inert gas to be supplied into the vessel.

7. A method according to claim 6, wherein an internal pressure of the vessel is set to not more than 10 Torr by the supply of the Argon gas.

8. A method according to claim 5, wherein after the step of forming the nanoparticle porous film by evaporating the semiconductor in the inert gas atmosphere, the step of forming the nanoparticle porous oxide film by oxidizing the semiconductor is successively performed without extracting the substrate from the vessel.

9. A method according to claim 5, wherein after the step of forming a nanoparticle thin film by evaporating the semiconductor in the inert gas atmosphere, the substrate is extracted from the vessel and placed in another vessel, and the step of forming a nanoparticle oxide thin film by oxidizing the semiconductor is performed in the other vessel.

10. A method according to claim 1, wherein the step of forming a nanoparticle thin film on a substrate to be processed comprises coating the substrate with nanoparticles of the semiconductor.

11. A method according to claim 10, wherein the nanoparticles with which the substrate is to be coated are evenly dispersed in a solution which does not dissolve the nanoparticles.

12. A method according to claim 10, wherein the substrate is rotated when coated with the nanoparticles of the semiconductor.

13. A method of fabricating a semiconductor device having a nanoparticle porous oxide film, comprising:

supplying an inert gas into a vessel which contains Silicon as an evaporation source and a substrate to be processed, and evaporating the Silicon in an inert gas atmosphere by heating the Silicon, thereby forming a nanoparticle porous film of the Silicon on the substrate; and oxidizing the Silicon by annealing the substrate in an Oxygen atmosphere, thereby forming a nanoparticle porous oxide film consisting of Silicon oxide.

14. A method according to claim 13, wherein the step of forming the nanoparticle porous film of Silicon on the substrate to be processed comprises forming the nanoparticle porous film in which pores do not extend to the surface but are closed.

15. A method according to claim 13, wherein the nanoparticle porous oxide film of the Silicon formed by oxidizing the Silicon is used as an interlayer insulator requiring a low dielectric constant.

16. A method according to claim 13, wherein the step of forming the nanoparticle porous film of Silicon on the substrate to be processed comprises using Argon as the inert gas to be supplied into the vessel.

17. A method according to claim 14, wherein an internal pressure of the vessel is set to not more than 10 Torr by the supply of the Argon gas.

18. The method of fabricating a semiconductor device having a nanoparticle porous oxide film comprising:

evaporating a semiconductor material to form nanoparticles in an atmosphere;

depositing the nanoparticles on a substrate to be processed, thereby forming a nanoparticle porous film of the semiconductor; and oxidizing the semiconductor by annealing the substrate in an Oxygen atmosphere, thereby forming a nanoparticle porous oxide film comprising an oxide of the semiconductor.

19. A method according to claim 18, wherein evaporating the semiconductor is preformed by resistance-heating the semiconductor.

* * * * *

UNITED STATES PATENT AND TRADEMARK OFFICE
CERTIFICATE OF CORRECTION

PATENT NO. : 6,962,882 B2
DATED : November 8, 2005
INVENTOR(S) : S. Nozaki et al.

It is certified that error appears in the above-identified patent and that said Letters Patent is hereby corrected as shown below:

Title page,
Item [56], References Cited, OTHER PUBLICATIONS, "Nozaki, S., et al.," reference, "Nanoparticles." should read -- Nanoparticles, --; and "Burl-ingame," should break -- Bur-lingame, --.

Column 10,
Line 16, "The method" should read -- A method --.
Line 28, "preformed" should read -- performed --.

Signed and Sealed this

Twenty-first Day of March, 2006

JON W. DUDAS
*Director of the United States Patent and Trademark Office*